(12) United States Patent
Nin (10) Patent No.: US 11,837,322 B2
(45) Date of Patent: Dec. 5, 2023

(54) MEMORY DEVICES OPERATING ON DIFFERENT STATES OF CLOCK SIGNAL

(71) Applicant: CHANGXIN MEMORY TECHNOLOGIES, INC., Hefei (CN)

(72) Inventor: Shu-Liang Nin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 140 days.

(21) Appl. No.: 17/409,915

(22) Filed: Aug. 24, 2021

(65) Prior Publication Data
US 2022/0068333 A1 Mar. 3, 2022

Related U.S. Application Data

(63) Continuation of application No. PCT/CN2021/103706, filed on Jun. 30, 2021.

(30) Foreign Application Priority Data

Aug. 26, 2020 (CN) .......................... 202010874183.5

(51) Int. Cl.
*G11C 7/22* (2006.01)
*G11C 7/10* (2006.01)

(52) U.S. Cl.
CPC ............ *G11C 7/222* (2013.01); *G11C 7/1063* (2013.01); *G11C 7/1069* (2013.01); *G11C 7/1096* (2013.01)

(58) Field of Classification Search
CPC ..... G11C 7/222; G11C 7/1063; G11C 7/1069; G11C 7/1096
See application file for complete search history.

(56) References Cited

U.S. PATENT DOCUMENTS

| 8,194,090 | B2 | 6/2012 | Sato |
| 8,447,908 | B2 | 5/2013 | Bruce |
| 8,635,390 | B2 | 1/2014 | Hnatko |
| 8,947,931 | B1 | 2/2015 | D'Abreu |
| 9,170,744 | B1 | 10/2015 | Smith |
| 9,396,766 | B2 | 7/2016 | Lym |
| 9,805,802 | B2 | 10/2017 | Son et al. |
| 10,068,624 | B2 * | 9/2018 | Kwon ................. G06F 13/1678 |

(Continued)

FOREIGN PATENT DOCUMENTS

| CN | 1502108 A | 6/2004 |
| CN | 101488337 A | 7/2009 |

(Continued)

OTHER PUBLICATIONS

International Search Report in the international application No. PCT/CN2021/104776, dated Oct. 13, 2021, 2 pgs.

(Continued)

*Primary Examiner* — Vanthu T Nguyen
(74) *Attorney, Agent, or Firm* — Cooper Legal Group, LLC (57) ABSTRACT

A memory is provided. The memory includes a control chip (114) and a plurality of memory chips (100). The plurality of memory chips are electrically connected to the control chip (114) by sharing a channel (01). The plurality of memory chips (100) are configured to adopt the same clock signal, and each of the plurality of memory chips (100) is configured to perform information interaction with the control chip (114) in a different clock state of the clock signal.

15 Claims, 6 Drawing Sheets

(56) References Cited

U.S. PATENT DOCUMENTS

| | | | |
|---|---|---|---|
| 10,446,198 B2 | 10/2019 | Hasbun et al. | |
| 10,725,913 B2 | 7/2020 | Hasbun et al. | |
| 10,915,473 B2* | 2/2021 | Jang | G06F 13/1657 |
| 10,978,116 B2 | 4/2021 | Hasbun et al. | |
| 2002/0060948 A1 | 5/2002 | Chang | |
| 2002/0174311 A1 | 11/2002 | Ware | |
| 2004/0054845 A1 | 3/2004 | Ware | |
| 2004/0066701 A1 | 4/2004 | Kaiser | |
| 2004/0105292 A1 | 6/2004 | Matsui | |
| 2004/0170072 A1 | 9/2004 | Ware | |
| 2005/0169097 A1 | 8/2005 | Ware | |
| 2006/0007761 A1 | 1/2006 | Ware | |
| 2006/0039174 A1 | 2/2006 | Ware | |
| 2006/0069895 A1 | 3/2006 | Ware | |
| 2006/0090149 A1 | 4/2006 | Blanco | |
| 2006/0129776 A1 | 6/2006 | Ware | |
| 2006/0233012 A1 | 10/2006 | Sekiguchi | |
| 2007/0064462 A1 | 3/2007 | Matsui | |
| 2007/0255919 A1 | 11/2007 | Ware | |
| 2009/0063887 A1 | 3/2009 | Ware | |
| 2009/0122587 A1 | 5/2009 | Matsui | |
| 2009/0138646 A1 | 5/2009 | Ware | |
| 2009/0150710 A1 | 6/2009 | Bilger | |
| 2009/0184971 A1 | 7/2009 | Sato | |
| 2010/0302874 A1 | 12/2010 | Takahashi | |
| 2011/0161568 A1 | 6/2011 | Bruce | |
| 2011/0164460 A1 | 7/2011 | Kajigaya | |
| 2012/0059958 A1 | 3/2012 | Hnatko | |
| 2012/0059977 A1 | 3/2012 | Chuang | |
| 2012/0092944 A1 | 4/2012 | Lin | |
| 2012/0213020 A1 | 8/2012 | Ware | |
| 2012/0287725 A1 | 11/2012 | Ware | |
| 2013/0148448 A1 | 6/2013 | Matsui | |
| 2013/0227229 A1 | 8/2013 | Ishikawa | |
| 2013/0250706 A1 | 9/2013 | Ware et al. | |
| 2013/0279278 A1 | 10/2013 | Ware et al. | |
| 2013/0305079 A1 | 11/2013 | Ware et al. | |
| 2014/0056093 A1 | 2/2014 | Tran et al. | |
| 2014/0098622 A1 | 4/2014 | Ware et al. | |
| 2014/0169111 A1 | 6/2014 | Kajigaya et al. | |
| 2014/0293705 A1 | 10/2014 | Gillingham | |
| 2014/0340978 A1 | 11/2014 | Tran et al. | |
| 2015/0043290 A1 | 2/2015 | Ware et al. | |
| 2016/0065190 A1 | 3/2016 | Paul | |
| 2016/0093378 A1 | 3/2016 | Lym | |
| 2016/0196864 A1 | 7/2016 | Ware et al. | |
| 2017/0053691 A1 | 2/2017 | Ware et al. | |
| 2017/0069364 A1 | 3/2017 | Shin et al. | |
| 2017/0076768 A1 | 3/2017 | Son et al. | |
| 2017/0194945 A1 | 7/2017 | Paul | |
| 2017/0365309 A1 | 12/2017 | Shin et al. | |
| 2018/0005689 A1 | 1/2018 | Hsieh | |
| 2018/0012644 A1 | 1/2018 | Ware et al. | |
| 2018/0033489 A1 | 2/2018 | Son et al. | |
| 2018/0218762 A1 | 8/2018 | Matsui | |
| 2018/0293190 A1 | 10/2018 | Jang | |
| 2019/0065050 A1 | 2/2019 | Shin et al. | |
| 2019/0102298 A1 | 4/2019 | Hasbun et al. | |
| 2019/0102330 A1 | 4/2019 | Hasbun et al. | |
| 2019/0103143 A1 | 4/2019 | Hasbun et al. | |
| 2019/0103152 A1* | 4/2019 | Matsui | G11C 7/1063 |
| 2019/0146911 A1 | 5/2019 | Ha et al. | |
| 2019/0198084 A1 | 6/2019 | Penney | |
| 2019/0205051 A1 | 7/2019 | Choi et al. | |
| 2019/0311762 A1 | 10/2019 | Penney | |
| 2019/0325936 A1 | 10/2019 | Ware et al. | |
| 2019/0348085 A1 | 11/2019 | Matsui | |
| 2020/0020367 A1 | 1/2020 | Hasbun et al. | |
| 2020/0075069 A1 | 3/2020 | Kim | |
| 2020/0125257 A1 | 4/2020 | Shin et al. | |
| 2020/0125506 A1 | 4/2020 | Crisp | |
| 2020/0176038 A1 | 6/2020 | Kim | |
| 2020/0202910 A1 | 6/2020 | Park et al. | |
| 2020/0278790 A1 | 9/2020 | Shin et al. | |
| 2020/0327057 A1 | 10/2020 | Hasbun et al. | |
| 2021/0027825 A1 | 1/2021 | Ware et al. | |
| 2021/0272608 A1 | 9/2021 | Matsui | |
| 2021/0358529 A1 | 11/2021 | Shin et al. | |
| 2022/0351764 A1 | 11/2022 | Shin et al. | |

FOREIGN PATENT DOCUMENTS

| | | | |
|---|---|---|---|
| CN | 102402493 A | 4/2012 | |
| CN | 102456392 A | 5/2012 | |
| CN | 102541782 A | 7/2012 | |
| CN | 103150272 A | 6/2013 | |
| CN | 106463499 A | 2/2017 | |
| CN | 106796813 A | 5/2017 | |
| CN | 109599138 A | 4/2019 | |
| CN | 109599139 A | 4/2019 | |
| CN | 109599141 A | 4/2019 | |
| CN | 109783009 A | 5/2019 | |
| CN | 109994138 A | 7/2019 | |
| CN | 110880341 A | 3/2020 | |
| CN | 111540391 A | 8/2020 | |
| CN | 211207252 U | 8/2020 | |

OTHER PUBLICATIONS

International Search Report in the international application No. PCT/CN2021/098752, dated Sep. 8, 2021, 2 pgs.

International Search Report in the international application No. PCT/CN2021/099868, dated Sep. 15, 2021, 2 pgs.

International Search Report in the international application No. PCT/CN2021/103706, dated Sep. 28, 2021, 2 pgs.

International Search Report in the international application No. PCT/CN2021/125785, dated Jan. 25, 2022, 3 pgs.

Supplementary European Search Report in the European application No. 21860596.2, dated Nov. 23, 2022, 8 pgs.

Supplementary Partial European Search Report in the European application No. 21859788.8, dated Dec. 1, 2022, 17 pgs.

Supplementary European Search Report in the European application No. 21859858.9, dated Apr. 25, 2023. 7 Pages.

First Office Action of the Chinese application No. 202010874183.5, dated Jul. 12, 2023. 8 pages with English abstract.

* cited by examiner

MEMORY DEVICES OPERATING ON DIFFERENT STATES OF CLOCK SIGNAL

CROSS-REFERENCE TO RELATED APPLICATION

The present application is a continuation application of International Application No. PCT/CN2021/103706, filed on Jun. 30, 2021, and claims priority to Chinese Patent Application No. 202010874183.5, filed on Aug. 26, 2020 and entitled "MEMORY". The contents of International Application No. PCT/CN2021/103706 and Chinese Patent Application No. 202010874183.5 are hereby incorporated by reference in their entireties.

BACKGROUND

A Dynamic Random Access Memory (DRAM) is a common semiconductor memory device in a computer and is composed of many memory cells. Each memory cell usually includes a capacitor and a transistor. A gate of the transistor is connected with a word line, a drain of the transistor is connected with a bit line, and a source of the transistor is connected with the capacitor. A voltage signal on the word line can control the transistor to be turned on or turned off, and then data information stored in the capacitor can be read through the bit line, or the data information can be written, through the bit line, into the capacitor for storage.

With the application of the DRAM in more and more fields, for example, the DRAM is increasingly applied to various fields, a requirement of a user on a performance index of the DRAM is higher and higher, and the requirements on the DRAM are different due to different application fields.

SUMMARY

The embodiments of the present disclosure relate to the field of semiconductor technologies, and provide a memory.

The embodiments of the present disclosure provide a memory. The memory may include a control chip and multiple memory chips. The multiple memory chips may be electrically connected to the control chip by sharing a channel. The multiple memory chips may be configured to adopt the same clock signal, and each of the multiple memory chips may be configured to perform information interaction with the control chip in a different clock state of the clock signal.

BRIEF DESCRIPTION OF THE DRAWINGS

One or more embodiments are exemplarily described with the figures in the accompanying drawings. The exemplary description is not to be construed as limiting the embodiments. The elements with the same reference numerals in the accompanying drawings represent similar elements. Unless otherwise specified, the figures in the accompanying drawings do not form a scale limitation.

DETAILED DESCRIPTION

It is known from the background that the performance of the memory in the related art needs to be improved.

In order to solve the above problem, the embodiments of the present disclosure provide a memory. The memory includes a control chip and multiple memory chips. The multiple memory chips are electrically connected to the control chip by sharing a channel. The multiple memory chips are configured to adopt the same clock signal, and each of the multiple memory chips is configured to perform information interaction with the control chip in a different clock state of the clock signal. Since the multiple memory chips share the channel, the number of channels required by the memory is reduced without affecting the quality of the information interaction between the multiple memory chips and the control chip, thereby reducing the area of the memory, reducing the cost of the memory and reducing the power consumption of the memory.

To make the objects, technical solutions, and advantages of the embodiment of the present disclosure clearer, various embodiments of the present disclosure will be set forth in detail with reference to the accompanying drawings. However, those of ordinary skill in the art can understand that in various embodiments of the present disclosure, many technical details are proposed to make readers understand the present disclosure better. However, the technical solutions claimed by the present disclosure may also be implemented even without these technical details and various variations and modifications made based on the following embodiments.

Figure 1:
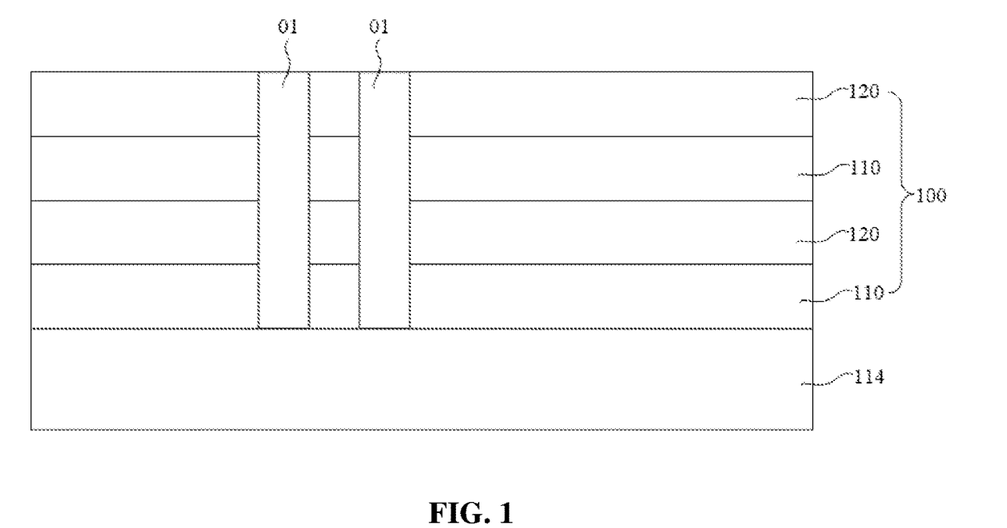
FIG. 1 is a structural schematic diagram of a memory provided by an embodiment of the present disclosure.

FIG. 1 is a structural schematic diagram of a memory provided by an embodiment of the present disclosure.

Referring to FIG. 1, in the embodiment, the memory includes: a control chip 114, and multiple memory chips 100. The multiple memory chips 100 are electrically connected to the control chip 114 by sharing a channel. The multiple memory chips 100 are configured to adopt the same clock signal, and each of the multiple memory chips 100 is configured to perform information interaction with the control chip 114 in a different clock state of the clock signal.

Since each of the multiple memory chips 100 performs information interaction with the control chip 114 in a different clock state of the clock signal, in the case of one clock signal, the single memory chip 100 transmits data at one of a rising edge or a falling edge of the clock signal, so that the memory can transmit the data in all different clock states of the clock signal, that is, the memory can transmit the data at both the rising edge and the falling edge of the clock signal. The clock signal in the embodiment may refer to one clock signal or may refer to multiple clock signals, and the embodiment does not limit this.

In the following, the memory provided by the embodiment will be described in detail with reference to the accompanying drawings.

In the embodiment, the memory may be a Dynamic Random Access Memory (DRAM).

Specifically, the multiple memory chips 100 may be sequentially stacked on the control chip 114, so that the storage density is improved and the distance between the memory chip 100 and the control chip 114 is reduced. Or, the multiple memory chips 100 may be arranged side by side on the control chip 114, so that the longitudinal thickness of the memory is reduced. In the embodiment, the multiple memory chips 100 are sequentially stacked on the control chip 114, and the channel 01 includes a through silicon via (TSV).

In the embodiment, the multiple memory chips 100 include: a first memory chip 110 and a second memory chip 120. The first memory chip 110 is configured to perform information interaction with the control chip 114 at a rising edge of the clock signal. The second memory chip 120 is configured to perform information interaction with the control chip 114 at a falling edge of the clock signal.

An operating mode of the first memory chip 110 is to transmit data at the rising edge of the clock signal, and an operating mode of the second memory chip 120 is to transmit data at the falling edge of the clock signal. However, since the first memory chip 110 and the second memory chip 120 operate in different clock states of the same clock signal, the overall macro operating mode of the first memory chip 110 and the second memory chip 120 is to transmit the data at both the rising and falling edges of the clock signal. Therefore, for the single memory chip 100, the data is transmitted at one of the rising edge or the falling edge of the clock signal; and for the memory as a whole, the effect of transmitting the data at both the rising edge and the falling edge of the clock signal is achieved.

FIG. 1 illustrates two different channels 01, where two memory chips 100 share one channel 01 and the other two memory chips 100 share the other channel 01. Specifically, it may be that: as illustrated in FIG. 1, two adjacent memory chips 100 share the same channel 01, or two spaced memory chips 100 share the same channel 01. It will be appreciated that the memory may include any number of channels 01, and two memory chips 100 share the same channel 01.

Moreover, the clock signal includes a command clock signal and a data clock signal. Each of the multiple memory chips 100 is configured to perform the information interaction with the control chip 114 in the different clock state of the clock signal, which includes that: the first memory chip 110 is configured to perform the information interaction with the control chip 114 at a rising edge of at least one of the command clock signal or the data clock signal; and the second memory chip 120 is configured to perform the information interaction with the control chip 114 at a falling edge of the at least one of the command clock signal or the data clock signal.

Specifically, the clock state includes a first preset edge of the command clock signal and a second preset edge of the data clock signal. The first preset edge is a first rising edge or a first falling edge, and the second preset edge is a second rising edge or a second falling edge. Each memory chip 100 performs the information interaction with the control chip 114 at the first preset edge of the command clock signal, and each memory chip 100 performs the information interaction with the control chip 114 at the second preset edge of the data clock signal. More specifically, the memory chip 100 is configured to receive a command signal at the first preset edge of the command clock signal. The command signal is configured to control a read-write operation for the memory chip 100. The memory chip 100 is further configured to receive a data signal to be written into the memory chip 100 or transmit a data signal at the second preset edge of the data clock signal. For example, the first memory chip 110 is configured to receive a command signal at the first rising edge of the command clock signal, and receive a data signal to be written or transmit a data signal at the second rising edge of the data clock signal. The second memory chip 120 is configured to receive a command signal at the first falling edge of the command clock signal, and receive a data signal to be written or transmit a data signal at the second falling edge of the data clock signal. In the embodiment, the command clock signal and the data clock signal are the same clock signal, and accordingly, the first preset edge and the second preset edge are the same preset edge.

Figure 2:
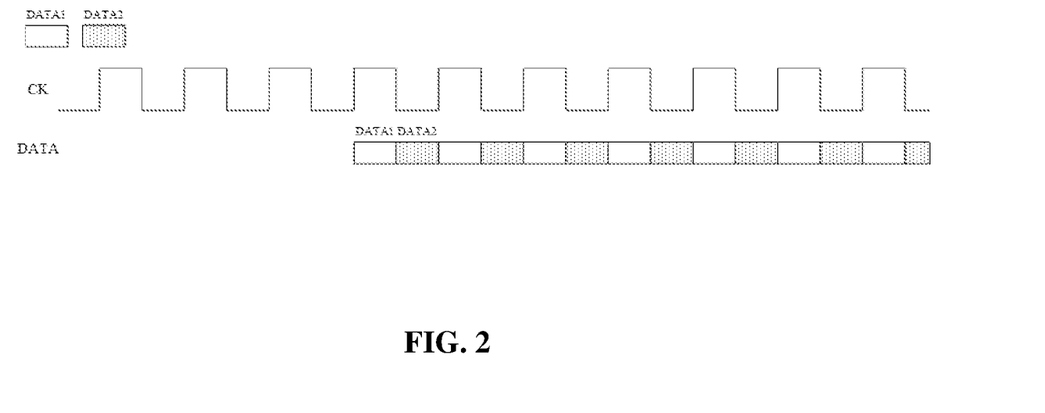
FIG. 2 is a timing diagram of operating signals corresponding to two memory chips which share a channel in a memory provided by an embodiment of the present disclosure.

FIG. 2 is a timing diagram of operating signals corresponding to two memory chips which share a channel in a memory provided by an embodiment of the present disclosure. The command clock signal and the data clock signal are the same clock signal, CK is the clock signal, DATA1 is the timing diagram of transmitting data by the first memory chip 110, DATA2 is the timing diagram of transmitting the data by the second memory chip 120, and DATA is the timing diagram of combining the DATA1 and the DATA2.

In the following, an operating principle of the memory provided by the embodiment will be described with reference to FIG. 2.

At the first rising edge of the clock signal, the first memory chip 110 receives an activation command signal; at the mth rising edge of the clock signal, the first memory chip 110 receives a read command signal; and at the nth rising edge of the clock signal, the first memory chip 110 transmits data. At the first falling edge of the clock signal, the second memory chip 120 receives an activation command signal; at the mth falling edge of the clock signal, the second memory chip 120 receives a read command signal; and at the nth falling edge of the clock signal, the second memory chip 120 transmits data. In this way, the first memory chip 110 transmits the data at different rising edges of the clock signal, and the second memory chip 120 transmits the data at different falling edges of the clock signal, until the transmission of the data is completed.

It will be appreciated that the above description is an example that the memory is subjected to the read operation, and likewise, during a write operation, the first memory chip 110 and the second memory chip 120 alternately transmit the data.

According to the memory provided by the embodiment, since the multiple memory chips 100 share the channel 01, the number of the channels 01 of the memory is reduced without affecting the bandwidth of the information interaction between the control chip 114 and the multiple memory chips 100, thereby reducing the manufacturing cost and the power consumption of the memory.

Another embodiment of the present disclosure also provides a memory. The memory is substantially the same as the aforementioned memory, and the main difference includes a more detailed description of each memory chip. In the following, the memory provided by the embodiment will be described in detail with reference to the accompanying drawings. It is to be noted that the same or corresponding parts as those of the foregoing embodiment may refer to the description of the aforementioned embodiment and will not be described in detail below.

Figure 3:
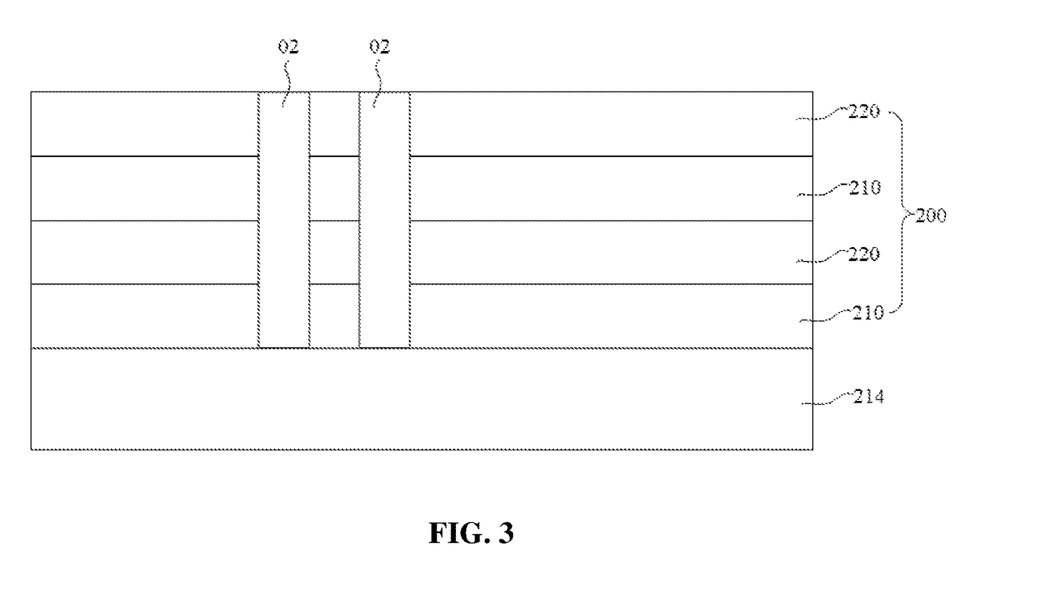
FIG. 3 is a structural schematic diagram of a memory provided by another embodiment of the present disclosure.
Figure 4:
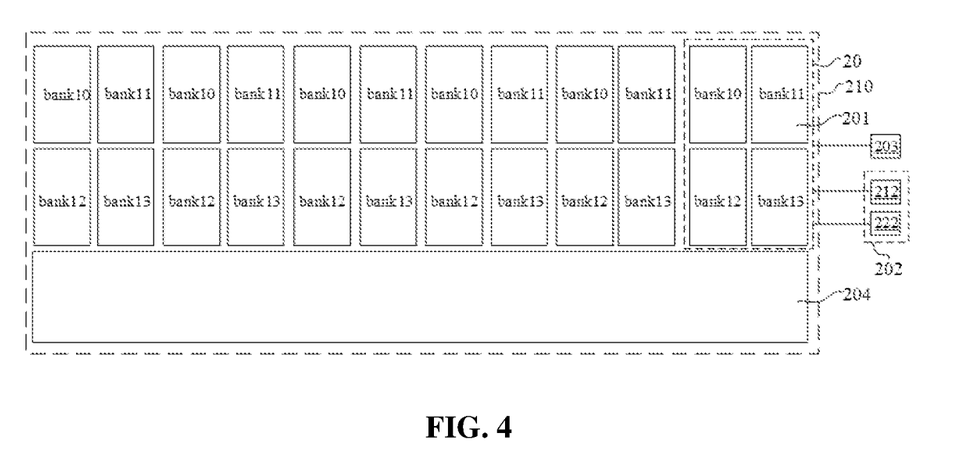
FIG. 4 is a structural schematic diagram of a memory chip in FIG. 3.

FIG. 3 is a structural schematic diagram of a memory provided by another embodiment of the present disclosure. FIG. 4 is a structural schematic diagram of a memory chip in FIG. 3.

Referring to FIG. 3 and FIG. 4, in the embodiment, the memory includes: a control chip 214 and multiple memory chips 200. The multiple memory chips 200 are electrically connected to the control chip 214 by sharing a channel 02. The multiple memory chips 200 are configured to adopt the same clock signal, and each of the multiple memory chips 200 is configured to perform information interaction with the control chip 214 in a different clock state of the clock signal. Specifically, the memory chips 200 include a first memory chip 210 and a second memory chip 220. The clock signal includes a command clock signal and a data clock signal. The first memory chip 210 is configured to perform the information interaction with the control chip 214 at a rising edge of at least one of the command clock signal or the data clock signal, and the second memory chip 220 is configured to perform the information interaction with the control chip 214 at a falling edge of the at least one of the command clock signal or the data clock signal.

Each memory chip 200 includes at least one channel 20. The channel 20 includes: multiple banks 201, herein, each bank 201 includes multiple memory cells, and the multiple banks 201 are configured to be alternately subjected to a read-write operation; a command port 202, herein, the command port 202 is configured to receive a command signal at a corresponding clock edge of the command clock signal, and the command signal is configured to control the read-write operation for the bank 201; and a data port 203, herein, the data port 203 is configured to receive a data signal to be written into the bank 201 or send a data signal at a corresponding clock edge of the data clock signal. The corresponding clock edge includes the rising edge or the falling edge. The command port 202 includes a row address port 212 and a column address port 222, the row address port 212 is configured to receive a row address signal corresponding to a position of a target memory cell, the column address port 222 is configured to receive a column address signal corresponding to the position of the target memory cell, and the target memory cell is a memory cell selected from the multiple memory cells.

It will be appreciated that the corresponding clock edge refers to the rising edge or the falling edge of the command clock signal corresponding to the information interaction performed by the memory chip 200, and the rising edge or the falling edge of the data clock signal corresponding to the information interaction performed by the memory chip 200.

It is to be noted that the command port in the embodiment includes, but is not limited to, a port that transmits a command signal and an address signal.

In the following, the memory provided by the embodiment will be described in detail with reference to the accompanying drawings.

The multiple memory cells in each bank 201 may be distributed in an array. In the embodiment, for example, each channel 20 includes four banks 201. In FIG. 4, four banks 201 in one channel 20 are illustrated by a bank10, a bank11, a bank12, and a bank13. It will be appreciated that in other embodiments, each channel 20 may include any other number of banks, for example, two or six or the like.

The data port 203 is configured to receive data to be stored into the memory cell or send data read from the memory cell.

The memory chip 200 includes multiple channels 20, and the memory chip 200 further includes a shared circuit 204 shared by the multiple channels 20. In the embodiment, the shared circuit 204 may be a test control circuit. The test control circuit is configured to perform test control over the multiple channels 20. In other embodiments, the shared circuit may also be at least one of a temperature sensor circuit, an analog circuit, or a charge pump circuit.

The memory may further include a test port. In a test mode, the multiple channels 20 share the same test port for testing. Due to the arrangement of the shared test port, the number of the ports in the memory is reduced, thereby reducing the difficulty in testing the memory by adopting a probe card and reducing the manufacturing difficulty of the probe card.

Specifically, the command clock signal has a first preset edge, and the data clock signal has a second preset edge. The first preset edge is a first rising edge or a first falling edge, and the corresponding clock edge of the command clock signal mentioned above is the first rising edge or the first falling edge. The second preset edge is a second rising edge or a second falling edge, and the corresponding clock edge of the data clock signal mentioned above is the second rising edge or the second falling edge. In the embodiment, the command clock signal and the data clock signal are the same clock signal, the first preset edge and the second preset edge are the same preset edge, and the preset edge may be one of the rising edge or the falling edge. In this way, a circuit design is simplified, a data receiving or sending error caused by an error generated through handshaking or synchronization of the command clock signal and the data clock signal is avoided, and the storage accuracy of the memory is improved. It is to be noted that in other embodiments, the command clock signal and the data clock signal may be different clock signals, and accordingly, the clock edge of the command clock signal and the clock edge of the data clock signal need to be distinguished.

In addition, in the embodiment, the two memory chips 200 share the channel 02, and the two memory chips 200 are electrically connected to the control chip 214 by sharing the channel 02. The two memory chips 200 are distinguished by the first memory chip 210 and the second memory chip 220. Herein, respective memory chips 200 adopt the same clock signal, command ports 202 of the respective memory chips 200 are configured to receive or send signals by adopting different clock edges, and data ports 203 of the respective memory chips 200 are configured to receive or send signals by adopting different clock edges.

For example, the command port 202 of the first memory chip 210 receives or sends the signal by adopting the first rising edge, the command port 202 of the second memory chip 220 receives or sends the signal by adopting the first falling edge, the data port 203 of the first memory chip 210 receives or sends the signal by adopting the second rising edge, and the data port 203 of the second memory chip 220 receives or sends the signal by adopting the second falling edge.

Specifically, the command signal includes an activation command signal and a read command signal corresponding to the activation command signal. The channel 20 is further configured such that after command port 202 receives the activation command signal for one of the banks 201, the command port 202 receives the read command signal corresponding to the activation command signal. More specifically, the activation command signal includes a row address signal. The row address signal is received through the row address port 212. The read command signal includes a column address signal. The column address signal is received through the column address port 222. It is to be noted that the activation command signal and the read command signal may also include other control signals in addition to the row address signal and the column address signal. These other control signals are configured to help or assist the memory chip 200 in identifying whether a command signal is the activation command signal or the read command signal. These other control signals may be received through other command ports in addition to the row address port 212 and the column address port 222. In this way, the row address port 212 may continuously receive the row address signals and the column address port 222 may continuously receive the column address signals. Accordingly, the channel 20 is also configured such that the activation command signal and the read command signal are received through different ports in the command port 202, thereby simultaneously receiving the activation command signal and the read command signal.

In the embodiment, the command signal includes an activation command signal and a read command signal corresponding to the activation command signal. The channel 20 is further configured such that after the command port 202 alternately receives activation command signals for different banks 201, the command port 202 alternately receives read command signals corresponding to the activation command signals. Specifically, after the row address port 212 alternately receives the activation command signals for the different banks 201, the column address port 222 alternately receives the read command signals corresponding to the activation command signals.

Moreover, the channel 20 is further configured such that after the command port 202 receives the read command signals, the data port 203 alternately sends data signals corresponding to the different banks 201.

Figure 5:
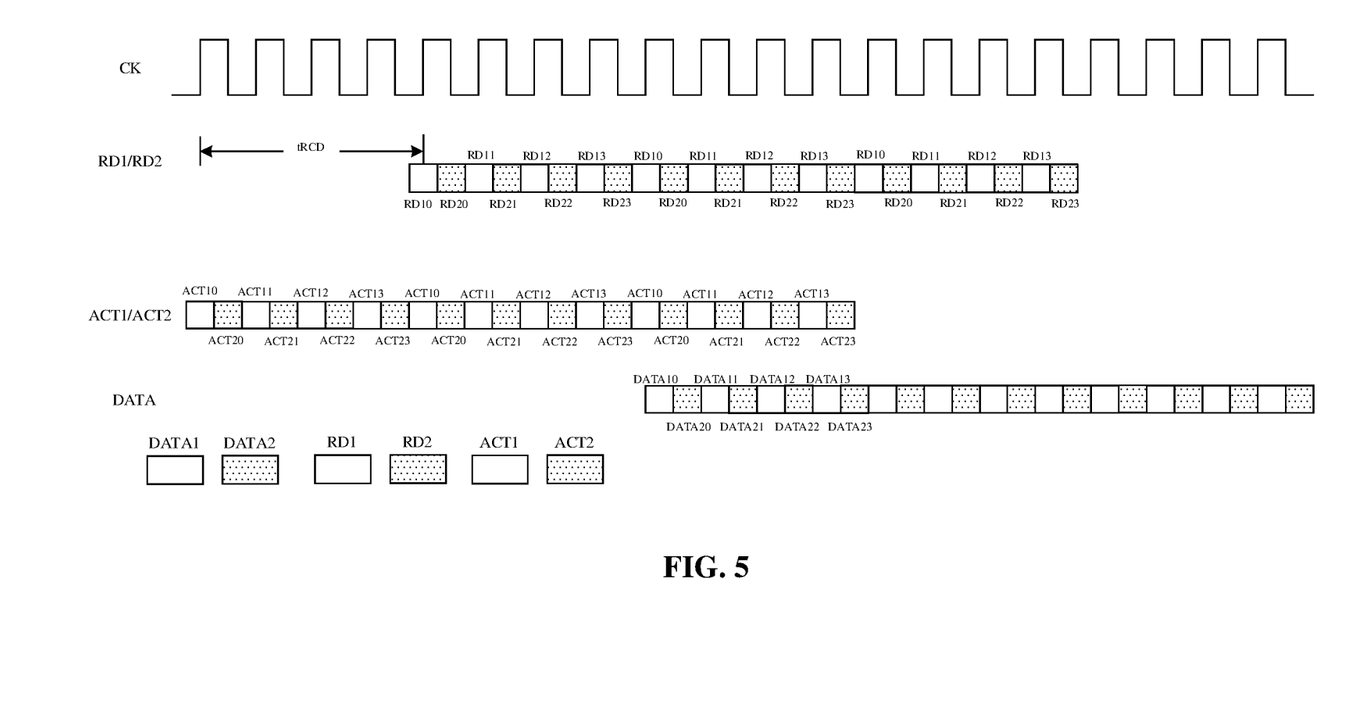
FIG. 5 is an operating timing diagram of a first memory chip and a second memory chip in FIG. 3.

FIG. 5 is an operating timing diagram of a first memory chip 210 and a second memory chip 220. In the following, an operating principle of the memory will be described with reference to the timing diagram.

In FIG. 5, the command clock signal and the data clock signal adopt the same clock signal. CK illustrates the clock signal, ACT1 illustrates a timing diagram of the activation command signals for the first memory chip 210, ACT2 illustrates a timing diagram of the activation command signals for the second memory chip 220, RD1 illustrates a timing diagram of the read command signals for the first memory chip 210, RD2 illustrates a timing diagram of the read command signals for the second memory chip 220, DATA1 illustrates a timing diagram of the data signals at the data port 203 of the first memory chip 210, and DATA2 illustrates a timing diagram of the data signals at the data port 203 of the second memory chip 220.

For example, the first memory chip 210 includes four banks 201 (the bank10, the bank11, the bank12, and the bank13). The activation command signals include ACT10, ACT11, ACT12 and ACT13 respectively configured to activate the bank10, the bank11, the bank12 and the bank13, where the ACT10 corresponds to the bank10, the ACT11 corresponds to the bank11, and the like. The read command signals include RD10, RD11, RD12 and RD13 in one-to-one correspondences with the bank10, the bank11, and the bank12. The data signals include DATA10, DATA11, DATA12 and DATA13. The activation command signal ACT10 corresponds to the bank10, the read command signal RD10 and the data signal DATA10. The activation command signal ACT11 corresponds to the bank11, the read command signal RD11, and the data signal DATA11. The activation command signal ACT12 corresponds to the bank12, the read command signal RD12 and the data signal DATA12. The activation command signal ACT13 corresponds to the bank13, the read command signal RD13 and the data signal DATA13. That is, one activation command signal corresponds to one read command signal. The detailed description about the activation command signals (ACT20, ACT21, ACT22, ACT23), the read command signals (RD20, RD21, RD22, RD23), and the data signals (DATA20, DATA21, DATA22, DATA23) corresponding to the second memory chip 220 may refer to the foregoing description.

As illustrated in FIG. 5, for the first memory chip 210, for example, the command port 202 and the data port 203 receive or send signals by adopting rising edges of the clock signal. After the command port 202 receives the activation command signal ACT10 for the bank 201 at a rising edge of the clock signal, the command port 202 receives the read command signal RD10 corresponding to the activation command signal ACT10 at a rising edge. After the command port 202 receives the read command signal RD10, the data port 203 sends the data signal DATA10 at a rising edge of the clock signal. A flow after the command port 202 receives the activation command signal ACT11, ACT12 or ACT13 is similar to the foregoing description. Specifically, the row address port 212 in the command port 202 receives the activation command signal ACT10 for activating the bank10 at the first rising edge of the clock signal. The row address port 212 in the command port 202 receives the activation command signal ACT11 for activating bank11 at the second rising edge of the clock signal, receives the activation command signal ACT12 for activating the bank12 at the third rising edge of the clock signal, and receives the activation command signal ACT12 for activating the bank13 at the fourth rising edge of the clock signal. The column address port 222 in the command port 202 receives the read command signal RD10 corresponding to the activation command signal ACT10 at the nth rising edge. The column address port 222 in the command port 202 receives the read command signal RD11 corresponding to the activation command signal ACT11 at the (n+1)th rising edge, receives the read command signal RD12 corresponding to the activation command signal ACT12 at the (n+2)th rising edge, and receives the read command signal RD13 corresponding to the activation command signal ACT13 at the (n+3)th rising edge. Herein, n is any natural number. Accordingly, the data port 203 sends the data signal DATA10 corresponding to the bank10 at the mth rising edge of the clock signal. The data port 203 sends the data signal DATA11 corresponding to the bank11 at the (m+1)th rising edge of the clock signal, sends the data signal DATA12 corresponding to the bank12 at the (m+2)th rising edge, and sends the data signal DATA13 corresponding to the bank13 at the (m+3)th rising edge. Herein, m is any natural number, and for each bank 201, the corresponding m is greater than n.

It is to be noted that in FIG. 5, for example, the activation command signals ACT10, ACT11, ACT12, and ACT13 are respectively received at the consecutive rising edges, that is, the activation command signals corresponding to the different banks 201 are respectively received at the consecutive rising edges. In other embodiments, the activation command signals corresponding to the different banks may also be respectively received at non-consecutive rising edges.

It can be easily seen from FIG. 5 that since the row address port 212 and the column address port 222 are not the same port, the row address port 212 may receive the activation command signal ACT12 while the column address port 222 receives the read command signal RD12. In this way, there is no need to wait for all read command signals to be received completely before the activation command signal can be received, so that a data bus may always be filled up, that is, the data port 203 may continuously transmit the data, thereby avoiding the idle problem of the data bus in a certain time period, and improving the storage speed of the memory.

Moreover, as illustrated in FIG. 5, for the second memory chip 220, for example, the command port 202 and the data port 203 receive or send signals by adopting falling edges of the clock signal. After the command port 202 receives the activation command signal ACT20 for the bank 201 at a falling edge of the clock signal, the command port 202 receives the read command signal RD20 corresponding to the activation command signal ACT20 at a falling edge. After the command port 202 receives the read command signal RD20, the data port 203 sends the data signal DATA20 at a falling edge of the clock signal. A process of sending the data signal DATA21, DATA22 or DATA23 by the second memory chip 220 will not be described in detail.

Since the first memory chip 210 and the second memory chip 220 respectively receive/send the signals at the rising edge and the falling edge of the clock signal, the first memory chip 210 and the second memory chip 220 which share the channel 02 transmit data without mutual interference.

In another example, the command signal includes an activation command signal and multiple read command signals corresponding to the activation command signal. The channel 20 is further configured such that after the command port 202 receives the activation command signal for one of the banks 201, the command port 202 receives a read command signal corresponding to the activation command signal at each of multiple corresponding clock edges, to enable the command port 202 to receive the multiple read command signals corresponding to the activation command signal at the multiple consecutive corresponding clock edges. The channel 20 is further configured such that the data port 203 respectively sends multiple data signals at multiple consecutive corresponding clock edges. The number of the data signals is the same as the number of the received read command signals.

Moreover, the command signal may include an activation command signal and multiple read command signals corresponding to the activation command signal. The channel 20 is further configured such that after the command port 202 alternately receives activation command signals for different banks 201, the command port 202 alternately receives respective multiple read command signals corresponding to each of the activation command signals. Specifically, after the command port 202 alternately receives the activation command signals for the different banks 201, the command port 202 receives a read command signal corresponding to one of the activation command signals at each of multiple corresponding clock edges, so that the command port 202 receives the multiple read command signals corresponding to the one of the activation command signals at the multiple consecutive clock edges, until the command port 202 completes the reception of the multiple read command signals corresponding to the activation command signal for one bank 201, and then the command port 202 receives the multiple read command signals corresponding to the activation command signal for another bank 201.

Figure 6:
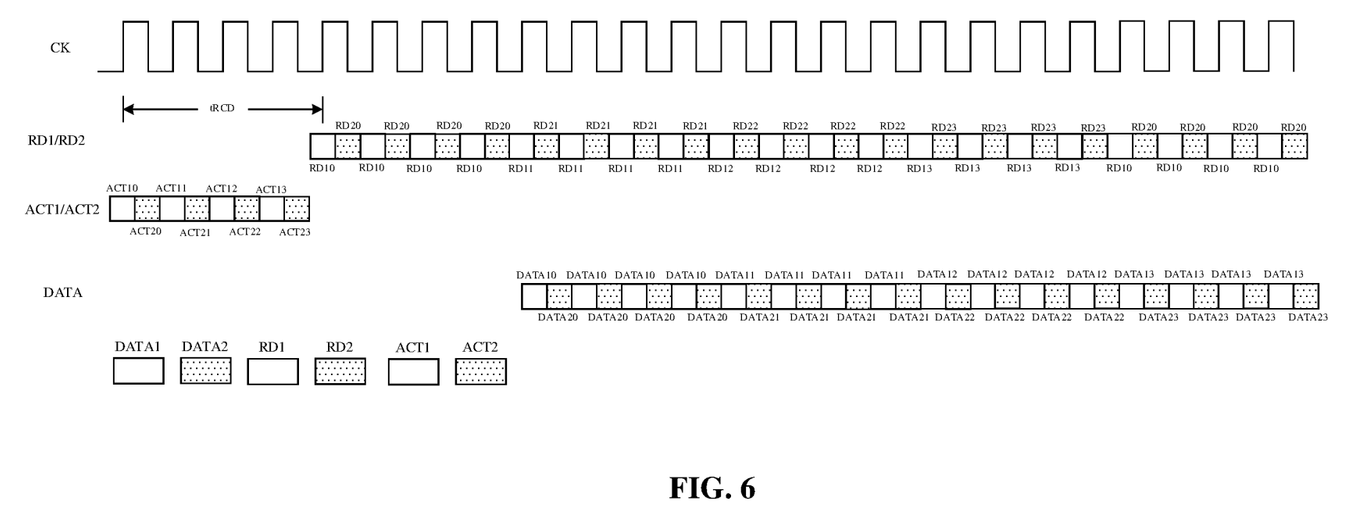
FIG. 6 is another operating timing diagram of a first memory chip and a second memory chip in FIG. 3.

FIG. 6 is another operating timing diagram of a first memory chip 210 and a second memory chip 220. In the following, the operating principle of the memory will be described with reference to the FIG. 6. For example, one activation command signal corresponds to four read command signals.

The description of each signal in FIG. 6 may refer to the description corresponding to FIG. 5, and the main difference between FIG. 6 and FIG. 5 includes that: the activation command signal ACT10 for activating the bank10 corresponds to four read command signals RD10 and four data signals DATA10, and the activation command ACT1 signal for activating the bank11 corresponds to four read command signals RD11 and data signals DATA11, and the like. That is, one activation command signal corresponds to multiple different read command signals.

For example, the first memory chip 210 receives or sends the signals at the rising edges of the clock signal. As illustrated in FIG. 6, after the command port 202 receives an activation command signal ACT10 for a bank 201 at a rising edge of the clock signal, the command port 202 receives four read command signals RD10 corresponding to the activation command signal ACT10 at four consecutive rising edges. After the command port 202 receives the read command signals RD10, the data port 203 sends four data signals DATA10 at rising edges of the clock signal. After an activation command signal ACT11 for another bank 201 is received, the command port 202 receives four read command signals RD11 corresponding to the activation command signal ACT11 at four consecutive rising edges. After the command port 202 receives the read command signals RD11, the data port 203 sends four data signals DATA11 at rising edges of the clock signal. The flow after the command port 202 receives an activation command signal ACT12 or ACT13 is similar to the foregoing description.

The second memory chip 220 sends or receives the signals at the falling edges of the clock signal, and the operating principle of the second memory chip 220 may refer to the operating principle of the first memory chip 210.

It is to be noted that in the embodiment, the channel 20 is further configured such that for any bank 201, a time difference between receiving the activation command signal and receiving the read command signal corresponding to the activation command signal is greater than or equal to a tRCD, the tRCD is the shortest preparation time required for the any bank 201 to prepare for being subjected to the read operation after receiving the activation command signal. Specifically, the tRCD is defined as an interval from row valid/active to the issue of a read/write command, that is, the delay from a Row Address Signal (RAS) to a Column Address Signal (CAS). The RAS is a row address strobe pulse signal referred as the row address signal. The CAS is a column address strobe pulse signal referred as the column address signal. The tRCD may be understood as a row strobe period. In this way, it is possible to ensure that the bank 201 has fully been activated before or when receiving the read command signal, and the read operation may be performed when the read command signal is received, thereby further improving the storage speed of the memory.

Specifically, the first memory chip 210 is taken as an example. As illustrated in FIG. 5 and FIG. 6, for the bank10, the time difference between the ACT10 and the RD10 is the tRCD. For the bank11, the time difference between the ACT11 and the RD11 may be greater than or equal to the tRCD, and the cases of the bank12 and the bank13 are not enumerated herein. No matter whether one activation command signal corresponds to one read command signal or multiple read command signals, reasonable settings can be provided to ensure that for any bank 201, the time difference between receiving the activation command signal for the any bank 201 and receiving the read command signal corresponding to the activation command signal may be greater than or equal to the tRCD.

In the memory provided by the embodiment, different banks 201 adopt the same command port 202 and the same data port 203. In other embodiments, different banks may adopt different command ports and different data ports.

According to the memory provided by the embodiment, since the row address port 212 is separated from the column address port 222, the row address signal and the column address signal may be transmitted simultaneously, so that a data receiving or sending error caused by an error generated through handshaking or synchronization of the command clock signal and the data clock signal is avoided, the problem that a data line is not occupied fully in certain time periods is solved, and the data line is ensured to be always occupied fully by the data, thereby improving the storage speed of the memory and improving the storage performance of the memory.

ADDITIONAL EMBODIMENTS

The embodiments of the present disclosure provide a memory. The memory includes a control chip and multiple memory chips. The multiple memory chips are electrically connected to the control chip by sharing a channel. The multiple memory chips are configured to adopt the same clock signal, and each of the multiple memory chips is configured to perform information interaction with the control chip in a different clock state of the clock signal.

In some embodiment, the multiple memory chips include: a first memory chip and a second memory chip. The first memory chip is configured to perform the information interaction with the control chip at a rising edge of the clock signal. The second memory chip is configured to perform the information interaction with the control chip at a falling edge of the clock signal.

In some embodiment, the clock signal includes a command clock signal and a data clock signal. Each of the multiple memory chips is configured to perform the information interaction with the control chip in the different clock state of the clock signal, which includes that: the first memory chip is configured to perform the information interaction with the control chip at a rising edge of at least one of the command clock signal or the data clock signal; and the second memory chip is configured to perform the information interaction with the control chip at a falling edge of the at least one of the command clock signal or the data clock signal.

In some embodiment, the clock state includes a first preset edge of the command clock signal and a second preset edge of the data clock signal. The first preset edge is a first rising edge or a first falling edge, and the second preset edge is a second rising edge or a second falling edge.

In some embodiment, each memory chip includes at least one channel. The channel includes: multiple banks, herein, each bank includes multiple memory cells and the multiple banks are configured to be alternately subjected to a read-write operation; a command port, herein, the command port is configured to receive a command signal at a corresponding clock edge of the command clock signal, and the command signal is configured to control the read-write operation for the bank; and a data port, herein, the data port is configured to receive a data signal to be written into the bank or send a data signal at a corresponding clock edge of the data clock signal. The corresponding clock edge includes the rising edge or the falling edge, the command port includes a row address port and a column address port, the row address port is configured to receive a row address signal corresponding to a position of a target memory cell, the column address port is configured to receive a column address signal corresponding to the position of the target memory cell, and the target memory cell is a memory cell selected from the multiple memory cells.

In some embodiment, the command clock signal and the data clock signal are the same clock signal.

In some embodiment, the multiple memory chips are electrically connected to the control chip by sharing the channel, which includes that: two memory chips are electrically connected to the control chip by sharing the channel. Herein, respective memory chips adopt the same clock signal, command ports of the respective memory chips are configured to receive or send signals by adopting different clock edges, and data ports of the respective memory chips are configured to receive or send signals by adopting different clock edges.

In some embodiment, the command signal includes an activation command signal and a read command signal corresponding to the activation command signal. The channel is further configured such that after the command port receives the activation command signal for one of the banks, the command port receives the read command signal corresponding to the activation command signal.

In some embodiment, the channel is further configured so that after the command port receives the read command signal, the data port sends the data signal.

In some embodiment, the command signal includes an activation command signal and multiple read command signals corresponding to the activation command signal. The channel is further configured such that after the command port receives the activation command signal for one of the banks, the command port receives a read command signal corresponding to the activation command signal at each of multiple corresponding clock edges, to enable the command port to receive the multiple read command signals corresponding to the activation command signal at the multiple consecutive corresponding clock edges.

In some embodiment, the channel is further configured such that the data port respectively sends multiple data signals at multiple consecutive corresponding clock edges. The number of the data signals is the same as the number of the received read command signals.

In some embodiment, the command signal includes an activation command signal and a read command signal corresponding to the activation command signal. The channel is further configured such that after the command port alternately receives activation command signals for different banks in the banks, the command port alternately receives read command signals corresponding to the activation command signals.

In some embodiment, the channel is further configured such that after the command port receives the read command signals, the data port alternately sends data signals corresponding to the different banks.

In some embodiment, the command signal includes an activation command signal and multiple read command signals corresponding to the activation command signal. The channel is further configured such that after the command port alternately receives activation command signals for different banks in the banks, and the command port alternately receives multiple respective read command signals corresponding to each of the activation command signals.

In some embodiment, the activation command signal includes the row address signal, and the read command signal includes the column address signal. The channel is further configured such that the activation command signal and the read command signal are received through different ports in the command port.

In some embodiment, the channel is further configured such that for any bank, a time difference between receiving the activation command signal and receiving the read command signal corresponding to the activation command signal is greater than or equal to a tRCD, and the tRCD is a shortest preparation time required for the any bank to prepare for being subjected to a read operation after receiving the activation command signal.

In some embodiment, the memory chip includes multiple channels, and the memory chip further includes a shared circuit shared by the multiple channels.

In some embodiment, the memory chip further includes: a test port. In a test mode, the multiple channels share the same test port for testing.

In some embodiment, the shared circuit includes a test control circuit. The test control circuit is configured to perform test control over the multiple channels.

In some embodiment, the multiple memory chips are sequentially stacked on the control chip, and the channel includes a through silicon via.

Compared with the related art, the technical solution provided by the embodiments of the present disclosure has the following advantages.

The embodiments of the present disclosure provide a memory with excellent structure performance. The multiple memory chips are electrically connected to the control chip by sharing a channel, the multiple memory chips are configured to adopt the same clock signal, and each of the multiple memory chips is configured to perform the information interaction with the control chip in a different clock state. Since the multiple memory chips are electrically connected with the control chip by sharing the channel, it is unnecessary to arrange, for each memory chip, a respective channel electrically connected with the control chip, so that the number of channels required by the memory is reduced, thereby reducing the cost and the power consumption of the memory.

Those of ordinary skill in the art can understand that each implementation mode is a specific embodiment of implementing the present disclosure. In practical applications, various variations about the forms and details may be made thereto without departing from the spirit and scope of the present disclosure. Any skilled in the art can make various changes and modifications without departing from the spirit and scope of the present disclosure. Therefore, the protection scope of the present disclosure should be limited by the scope of the claims.

The invention claimed is:

1. A memory, comprising:
a control chip; and
a plurality of memory chips electrically connected to the control chip by sharing a channel, the plurality of memory chips being configured to adopt a clock signal, and each of the plurality of memory chips being configured to perform information interaction with the control chip in a different clock state of the clock signal;
wherein the plurality of memory chips comprise a first memory chip and a second memory chip, the first memory chip is configured to perform the information interaction with the control chip at a rising edge of the clock signal, and the second memory chip is configured to perform the information interaction with the control chip at a falling edge of the clock signal;
wherein each of the plurality of memory chips comprises at least one channel, the channel comprising:
a plurality of banks, each of the plurality of banks comprising a plurality of memory cells, and the plurality of banks being configured to be alternately subjected to a read-write operation;
a command port, configured to receive, at a corresponding clock edge of the clock signal, a command signal for controlling the read-write operation for the plurality of banks; and
a data port, configured to receive a data signal to be written into a corresponding bank of the plurality of banks or send a data signal at the corresponding clock edge of the clock signal;
wherein the corresponding clock edge comprises the rising edge or the falling edge;
the command port comprises: a row address port configured to receive a row address signal corresponding to a position of a target memory cell selected from the plurality of memory cells, and a column address port configured to receive a column address signal corresponding to the position of the target memory cell; and the command signal comprises at least one activation command signal and at least one read command signal, the at least one activation command signal comprises the row address signal and the at least one read command signal comprises the column address signal.

2. The memory of claim 1, wherein the plurality of memory chips being electrically connected to the control chip by sharing the channel comprises: two memory chips of the plurality of memory chips being electrically connected to the control chip by sharing the channel; the two memory chips adopting the clock signal, command ports of the two memory chips being configured to receive or send signals by adopting different clock edges, and data ports of the two memory chips being configured to receive or send signals by adopting the different clock edges.

3. The memory of claim 1, wherein in response to an activation command signal of the at least one activation command signal corresponding to a read command signal of the at least one read command signal, a corresponding channel of the at least one channel is further configured such that after the command port receives the activation command signal for one of the plurality of banks, the command port receives the read command signal corresponding to the activation command signal.

4. The memory of claim 3, wherein the corresponding channel is further configured such that after the command port receives the read command signal, the data port sends the data signal.

5. The memory of claim 1, wherein in response to an activation command signal of the at least one activation command corresponding to a plurality of read command signals, a corresponding channel of the at least one channel is further configured such that after the command port receives the activation command signal for one of the plurality of banks, the command port receives a read command signal corresponding to the activation command signal at each of a plurality of consecutive corresponding clock edges, to enable the command port to receive the plurality of read command signals corresponding to the activation command signal at the plurality of consecutive corresponding clock edges.

6. The memory of claim 5, wherein the corresponding channel is further configured such that the data port respectively sends a plurality of data signals at the plurality of consecutive corresponding clock edges, a number of the data signals being the same as a number of the received read command signals.

7. The memory of claim 1, wherein in response to an activation command signal of the at least one activation command corresponding to a read command signal of the at least one read command signal, a corresponding channel of the at least one channel is further configured such that after the command port alternately receives activation command signals for different banks in the plurality of banks, the command port alternately receives read command signals corresponding to the activation command signals.

8. The memory of claim 7, wherein the corresponding channel is further configured such that after the command port receives the read command signals, the data port alternately sends data signals corresponding to the different banks.

9. The memory of claim 1, wherein in response to an activation command signal of the at least one activation command corresponding to a plurality of read command signals, a corresponding channel of the at least one channel is further configured such that after the command port alternately receives activation command signals for different banks in the plurality of banks, and the command port alternately receives a plurality of respective read command signals corresponding to each of the activation command signals.

10. The memory of claim 3, wherein the corresponding channel is further configured such that the activation command signal and the read command signal are received through different ports in the command port.

11. The memory of claim 10, wherein the corresponding channel is further configured such that for any bank of the plurality of banks, a time difference between receiving the activation command signal and receiving the read command signal corresponding to the activation command signal is greater than or equal to a tRCD, the tRCD being a shortest preparation time required for the any bank to prepare for being subjected to a read operation after receiving the activation command signal.

12. The memory of claim 1, wherein each of the plurality of memory chips comprises a plurality of channels, and wherein each of the plurality of memory chips further comprises a shared circuit shared by the plurality of channels.

13. The memory of claim 12, wherein each of the plurality of memory chips further comprises a test port, and wherein in a test mode, the plurality of channels share the test port for testing.

14. The memory of claim 12, wherein the shared circuit comprises a test control circuit, the test control circuit being configured to perform test control over the plurality of channels.

15. The memory of claim 1, wherein the plurality of memory chips are sequentially stacked on the control chip, wherein the channel comprises a through silicon via.

* * * * *